United States Patent
Pekarik et al.

(10) Patent No.: US 7,670,889 B2
(45) Date of Patent: Mar. 2, 2010

(54) STRUCTURE AND METHOD FOR FABRICATION JFET IN CMOS

(75) Inventors: John J. Pekarik, Underhill, VT (US); Richard A. Phelps, Colchester, VT (US); Robert M. Rassel, Colchester, VT (US); Yun Shi, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/132,638

(22) Filed: Jun. 4, 2008

(65) Prior Publication Data

US 2009/0302355 A1 Dec. 10, 2009

(51) Int. Cl.
*H01L 21/337* (2006.01)
*H01L 21/84* (2006.01)
(52) U.S. Cl. ........................ 438/186; 438/151
(58) Field of Classification Search ............. 438/186, 438/285, 592, 151, 300, 303; 257/256, 270, 257/280, 281, E21.403, E21.632, E29.265, 257/E29.314

See application file for complete search history.

(56) References Cited

U.S. PATENT DOCUMENTS

| 6,307,223 | B1  |    | 10/2001 | Yu     |         |
|-----------|-----|----|---------|--------|---------|
| 6,355,513 | B1  | *  | 3/2002  | Yu     | 438/186 |
| 7,102,181 | B1  |    | 9/2006  | Nowak et al. | |
| 2002/0086465 | A1 | * | 7/2002 | Houston | 438/149 |
| 2007/0284626 | A1 | * | 12/2007 | Vora et al. | 257/256 |

OTHER PUBLICATIONS

K. Akarvardar, et al.; "A Novel Four-Quadrant Analog Multiplier Using SOI Four-Gate Transistors (G4-FETs)"; pp. 1-4 (Date unknown).
Y. Baba, et al.; "High voltage trench drain LDMOS-FET using SOI water"; Volume, Issue, May 31-Jun. 3, 1994; pp. 1-4.
S. Cristoloveanu, et al.; "The Four-Gate Transistor"; URL: http://www.eurosoi.org/LP/publication_17.pdf; p. 323; ESSDERC 2002.

* cited by examiner

Primary Examiner—Thomas L Dickey
Assistant Examiner—Nikolay Yushin
(74) Attorney, Agent, or Firm—Anthony J. Canale; Greenblum & Bernstein P.L.C.

(57) ABSTRACT

A design structure, and more particularly, to a design structure for manufacturing a JFET in SOI, a JFET and methods of manufacturing the JFET are provided. The JFET includes a gate poly formed directly on an SOI layer and a gate oxide layer interposed between outer edges of the gate poly and the SOI layer.

19 Claims, 7 Drawing Sheets

US 7,670,889 B2

STRUCTURE AND METHOD FOR FABRICATION JFET IN CMOS

FIELD OF THE INVENTION

The invention relates to a design structure, and more particularly, to a design structure for manufacturing a JFET in SOI, a JFET and methods of manufacturing the JFET.

BACKGROUND

A junction gate field-effect transistor (JFET) is a simple type of field effect transistor. JFETs are used advantageously in some low-noise, high input-impedance op-amps and in switching applications. In fact, JFETs offer faster switching speed than bipolar transistors since JFETs are a majority carrier device.

A JFET consists of a long channel of semiconductor material doped so that it contains positive charge carriers (p-type) or negative charge carriers (n-type). In operation, electric current flows from the source to the drain, with the gate determining how much current flows through the device. By applying an increasing negative (for an n-channel JFET) bias voltage to the gate, the current flow from the source to drain can be impeded by pinching off the channel, in effect switching off the transistor.

This behavior is due to the depletion region of the PN junction expanding under the influence of a reverse-bias voltage, eventually occupying the entire width of the channel if the voltage is great enough. This operational behavior is opposite of the bipolar junction transistor or standard CMOS enhancement mode MOSFET transistors, which are normally-off. (JFETs, on the other hand, are normally-on devices where no voltage applied to the gate allows maximum current through the source and drain.)

In order to pinch off the channel, it is necessary to produce a certain voltage in a reverse direction (VGS) of the junction. The precise value of this pinch off voltage varies with individual JFETs, with typical values ranging between 0.5 to 10 V. The appropriate voltage bias can be easily remembered, as the n-channel device requires a negative gate-source voltage (VGS) to switch off the JFET and the p-channel device requires a positive gate-source voltage (VGS) to switch off the JFET.

The larger voltage pn junction avalanche breakdown (10V or greater for gate to drain or gate to source) capabilities make JFETs a candidate for certain applications such as power amplifiers. In comparison, standard CMOS SOI MOSFET devices cannot typically handle 10 V or greater thus making them not ideal candidates for certain applications such as that required for power amplifiers. Also, LD MOS process integration may not be cost effective for power amplifier applications as this process integration adds numerous mask levels and the extended lateral dimension increases circuit area requirement and hence lowers the profit margin.

Accordingly, there exists a need in the art to overcome the deficiencies and limitations described hereinabove.

SUMMARY

In a first aspect of the invention, a JFET structure comprises a gate poly formed directly on an SOI layer and a gate oxide layer interposed between outer edges of the gate poly and the SOI layer.

In another aspect of the invention, a method of forming a device comprises forming a gate oxide layer over an SOI layer and etching a portion of the gate oxide layer to expose a portion of the SOI layer. The method further includes depositing a poly layer over the exposed portion of the SOI layer and the gate oxide layer.

In a further aspect of the invention, a design structure tangibly embodied in a machine readable medium and executed on a machine for designing, manufacturing, or testing an integrated circuit. The design structure comprises a gate poly formed directly on an SOI layer and a gate oxide layer formed between outer edges of the gate poly and the SOI layer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
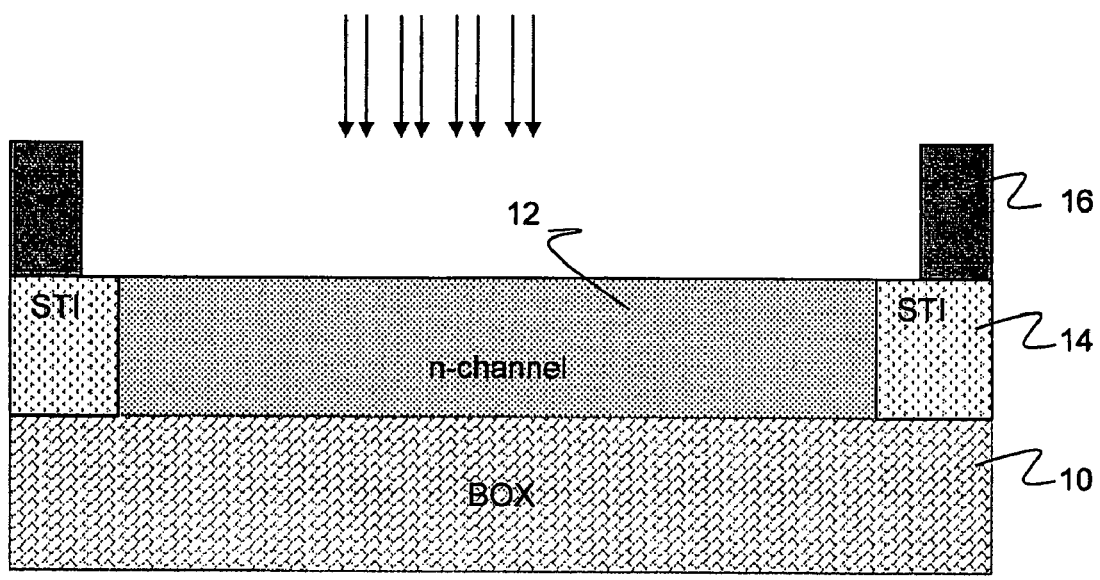
FIG. 1 shows a beginning structure and respective processing steps in accordance with an aspect of the invention.

FIG. 1 shows a beginning structure and respective processing steps in accordance with an aspect of the invention. The beginning structure includes a standard SOI 14 formed on a BOX 10, in a conventional manner. For example, the SOI 14 can be thermally bonded to the BOX 10. Trench structures are conventionally formed in the SOI 14 using, for example, lithographic and etching processes. The trench structures are filled with oxide to form shallow trench isolation (STI) structures 12. A photoresist 16 is deposited over the structure (STI and SOI) and patterned to form an opening. The deposition and patterning are performed using conventional processes and, as such, a further explanation is not required herein. An optional standard MOSFET N well implant is provided to form the n-channel in the SOI 14, through the opening.

Figure 2:
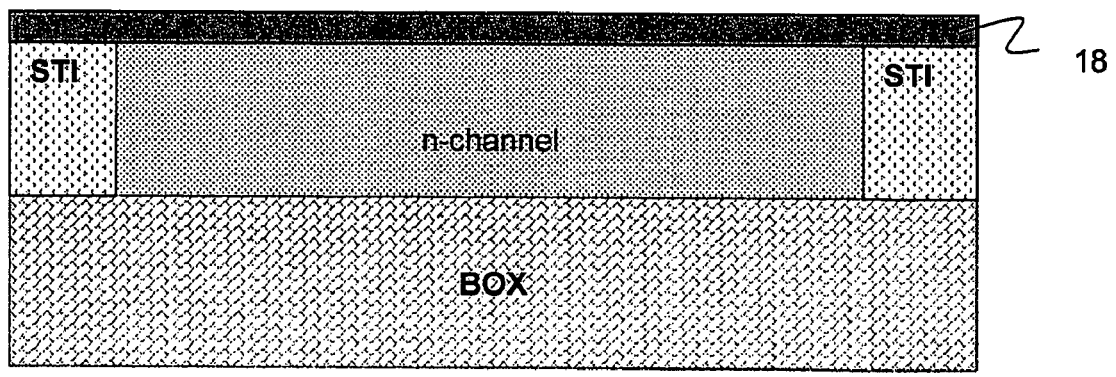
FIGS. 2-11 show intermediate structures and respective processing steps in accordance with an aspect of the invention.

FIGS. 2-11 show intermediate structures and respective processing steps in accordance with an aspect of the invention. In FIG. 2, the photoresist is stripped, standard well activation anneals performed, and a gate oxide layer 18 is formed from conventional CMOS processing over the STI 12 and the n-channel of the SOI 14. In embodiments, the gate oxide layer 18 is about 15 Å to 150 Å. In embodiments, the gate oxide layer 18 may be limited to over the n-channel of the SOI 14.

Figure 3:
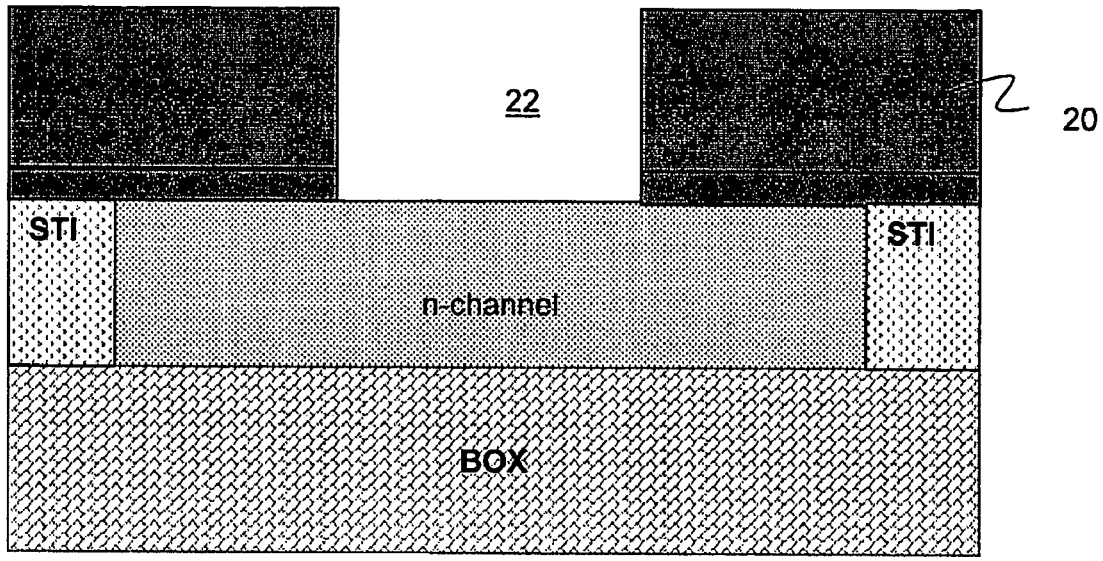
Figure 4:
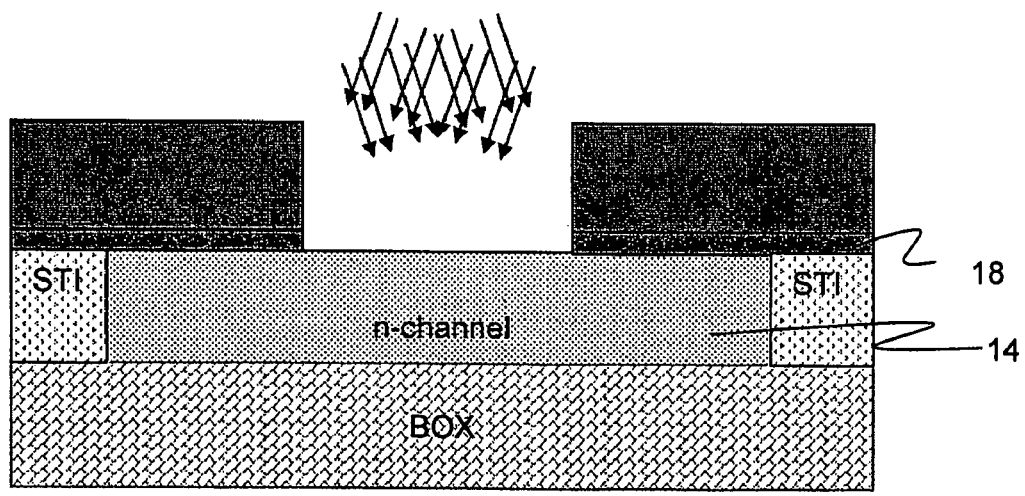

In FIG. 3, a photoresist 20 is deposited in a conventional manner over the structure of FIG. 2. In conventional lithographic and etching processes, an opening 22 is etched in the gate oxide layer 20 to expose portions of the SOI 14. In FIG. 4, an optional n-channel implant is performed through the opening 22. The n-channel implant includes an angled implantation so as to ensure that dopant is implanted in the SOI 14 below the gate oxide layer 18. Alternatively, a standard well implant can be performed prior to gate oxidation as shown in FIG. 1.

Figure 5:
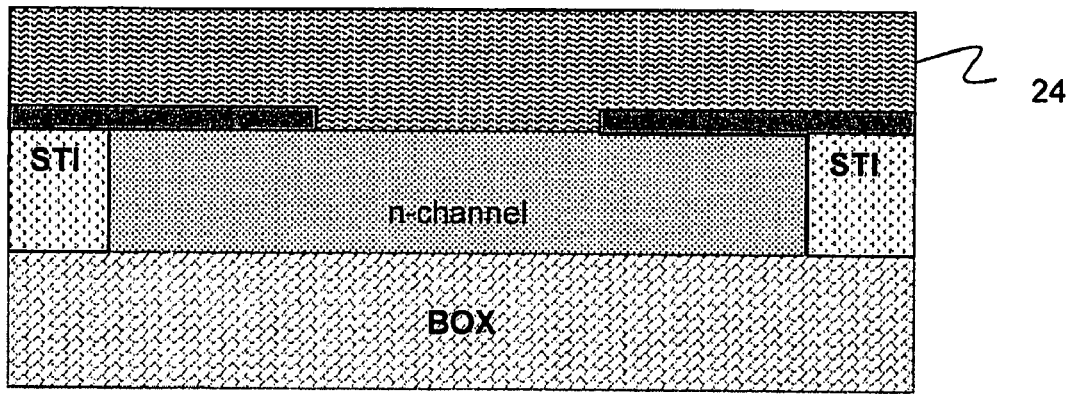

In FIG. 5, the photoresist 10 is stripped and a gate polysilicon layer 24 is deposited over the remaining structure of FIG. 4. More specifically, the gate polysilicon layer 24 is deposited directly on the n-channel of the SOI layer 14 and the gate oxide layer 18 (which is also directly deposited on the n-channel of the SOI layer 14).

Figure 6:
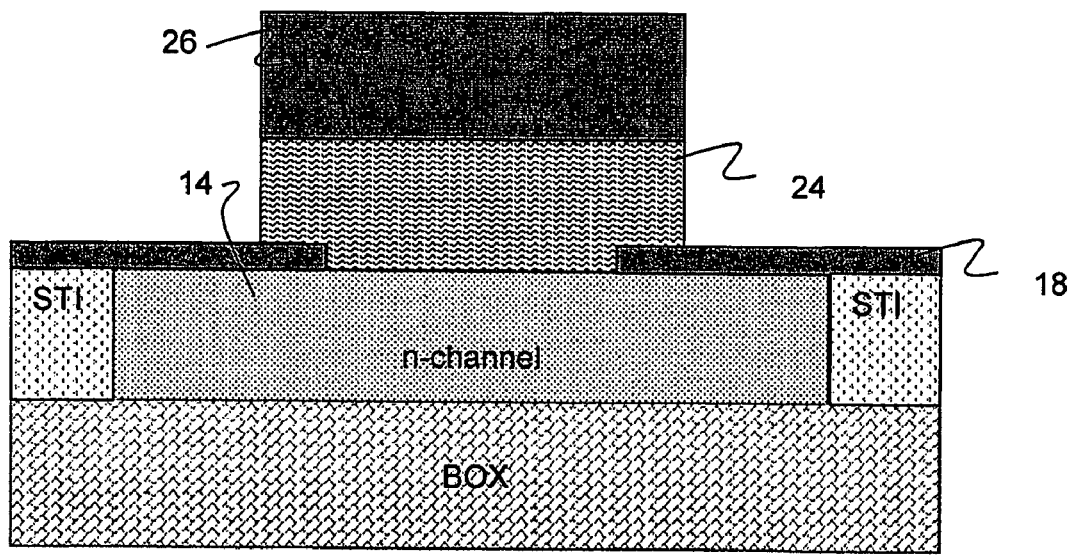

In FIG. 6, a photoresist 26 is deposited over the gate polysilicon layer 24 in a conventional deposition process. The photoresist 26 is patterned and the gate polysilicon layer 24 is etched back to the oxide layer 18 or to the underlying SOI (Si layer) 14. The standard poly etch does not aggressively attack the underlying SOI (Si layer) 14. As shown in FIG. 6, the gate polysilicon layer 24 remains on the SOI 14 and overlaps portions of the gate oxide layer 18, preferably over the soon to be formed drain and source regions. The photoresist 26 can then be stripped using conventional processes such as, for example, dilute HF stripping processes. If the oxide layer 18 is etched away during gate patterning a conformal thin oxide layer is formed, typically from conventional CVD processing and in a range of 20-80 Å, in order to protect the (Si layer) 14 and polysilicon during subsequent processing.

Figure 7:
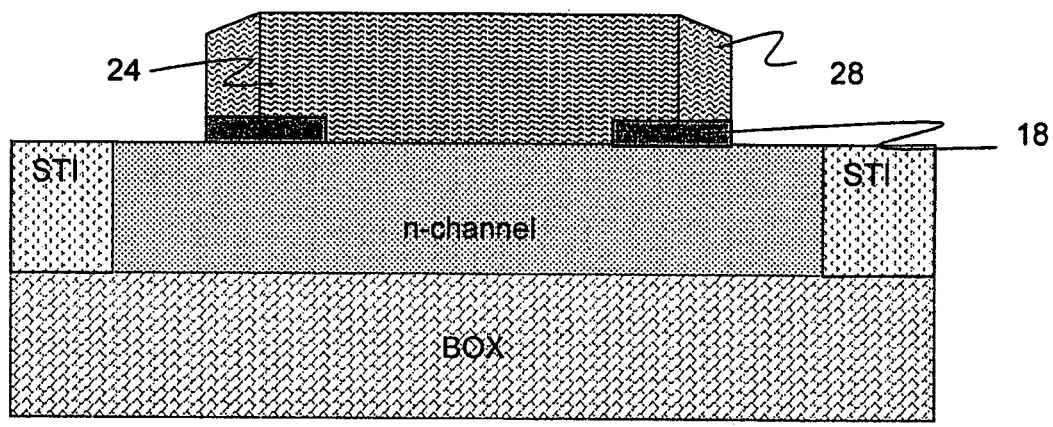

In FIG. 7, a spacer material is deposited on the structure of FIG. 6 and specifically on sides of the gate polysilicon layer 24 and over the adjacent remaining oxide gate layer 18 or SOI (Si layer) 14 to form a spacer 28. The spacer material may be, for example, a nitride and/or oxide material. In particular, using a conventional anisotropic etch the spacer material is etched away to set the profile of the spacer 28. During this etching step, portions of the oxide gate layer 18 or conformal thermal oxide spacer (combination of 28 and 18) are also etched away or reduced leaving a very thin pad film (10-60 Å), virtually exposing the n-channel of the SOI 14.

After etching, the remaining structure includes the oxide layer 18 underneath the profiled spacer 28 and underneath a portion of the gate polysilicon layer 24. As thus shown and described, the gate polysilicon layer 24 contacts directly on the n-channel of the SOI 14 and portions of the gate oxide layer 18. The gate oxide layer 18, underneath the edges of the gate polysilicon layer 24, is also in direct contact with the n-channel of the SOI 14. Also, the gate oxide layer 18 forms a collar around a perimeter of the gate polysilicon layer 24. This will prevent an n-Gate forming from self aligned nMOSFET source/drain implant from shorting to underlying n-channel. The collar also enables higher gate to drain avalanche breakdown, Vgd.

Although not shown, it should be recognized by those of skill in the art that the gate polysilicon layer 24 and the gate oxide layer 18 may be used to form a conventional FET in another region of the device, using the steps discussed herein, with the difference being that the gate oxide layer 18 will not be etched away to expose the underlying SOI. Accordingly, in another region, the device will include a layered structure comprising a gate oxide layer completely between an SOI and gate polysilicon layer.

Figure 8:
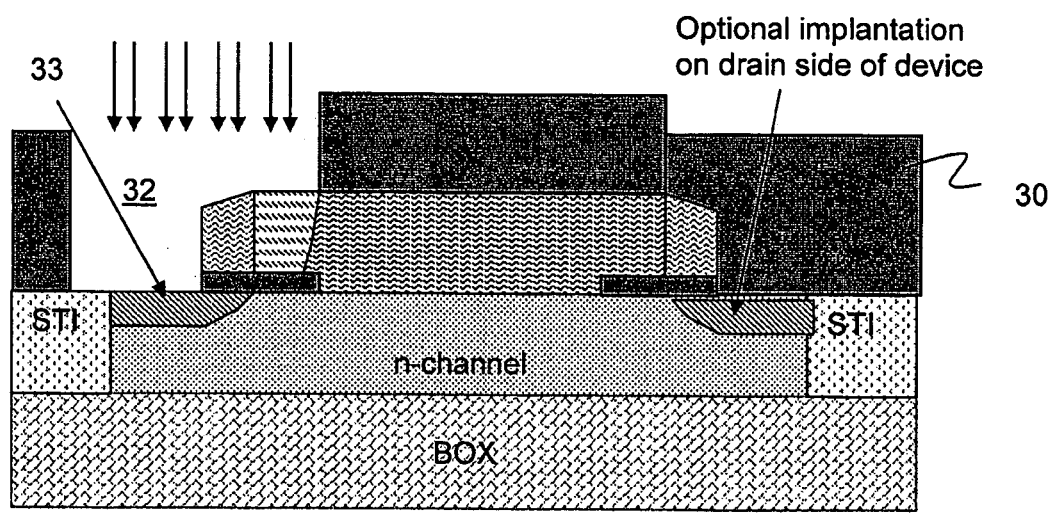

In FIG. 8, a photoresist 30 is deposited over the structure of FIG. 7. In a conventional manner using photolithographic and etching processes, an opening 32 is formed over the source region of the structure. In a preferred embodiment, the opening 32 will only be over the source region and would not extend to over the gate polysilicon layer 24; however, due to processing tolerances the opening 32 may extend over a portion of the gate polysilicon layer 24. An optional N-type extension implant 33 is performed through the opening 32 to lower the on-resistance of the device. The photoresist 30 is then stripped using conventional processes such as, for example, dilute HF stripping processes. An activation anneal is then performed on the structure. This process forms an asymmetrical device. The processes described with reference to FIG. 8 may optionally be performed on the drain side of the structure to form a symmetrical device.

In an optional embodiment, a symmetrical device may also be formed. This could be formed by blocking the N-type extension implant 33 with photoresist 30 from the entire JFET device. This process forms a symmetrical device and would typically be used for higher voltage applications. Optionally, a symmetric device may also be formed by creating openings in photoresist 30 over both the JFET source and drain regions only (similar to FIG. 10 photoresist pattern). This process forms a symmetrical device and would typically be used for lower voltage applications. An additional unique drain ion implant photoresist mask could be implemented if two different n-type dopant profiles for the JFET's source and drain are required. More specifically, the photoresist 30 would be stripped and another photoresist would be deposited over the structure. This photoresist would mask the source region which was previously implanted. In a conventional manner, an opening is formed over the drain region of the structure, preferably over the drain region and not extending over the gate polysilicon layer 24; however, due to processing tolerances the opening may extend over a portion of the gate polysilicon layer 24. An optional N-type extension implant is then performed through the opening to lower the on-resistance of the device. The photoresist can then be stripped using conventional processes such as, for example, dilute HF stripping processes. An activation anneal is then performed on the structure. This process forms a symmetrical device and would typically be used for low voltage applications.

Figure 9:
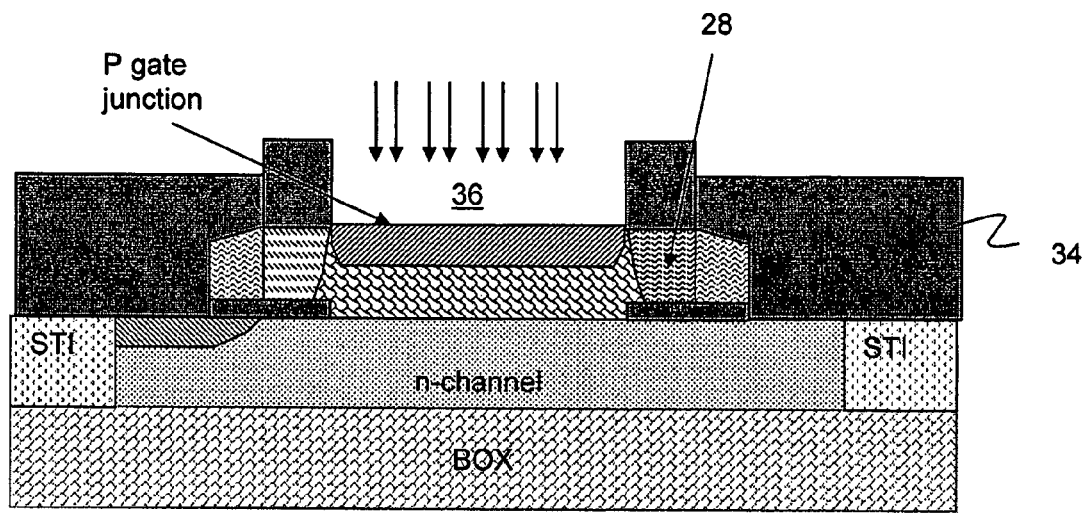

In FIG. 9, in a conventional manner, a photoresist 34 is deposited over the structure of FIG. 8. In a conventional manner using photolithographic and etching processes, an opening 36 is formed over the gate polysilicon layer 24 and preferably confined within the areas defined by the spacers 28. A P type dopant is implanted in the exposed gate polysilicon layer 24, through the opening 36, to form a p gate junction in the n-channel through outdiffusion from the gate polysilicon layer 24. The dopant may be, for example, Boron or Indium. The photoresist 34 is then be stripped using conventional processes such as, for example, dilute HF stripping processes.

Figure 10:
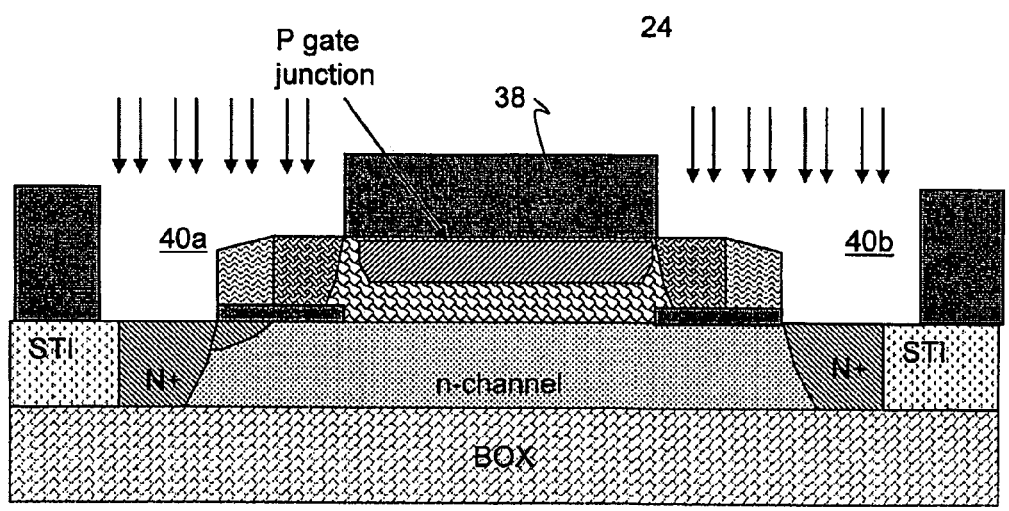

In FIG. 10, in a conventional manner, a photoresist 38 is deposited over the structure of FIG. 9. In a conventional manner using photolithographic and etching processes, openings 40a, 40b are formed over the source and drain regions, respectively. In a preferred embodiment, the openings would not extend to over the gate polysilicon layer 24; however, due to processing tolerances the openings may extend over a portion of the gate polysilicon layer 24. A conventional doping is performed to form N+ regions in the structure, while the photoresist 38 protects other portions of the structure.

Figure 11:
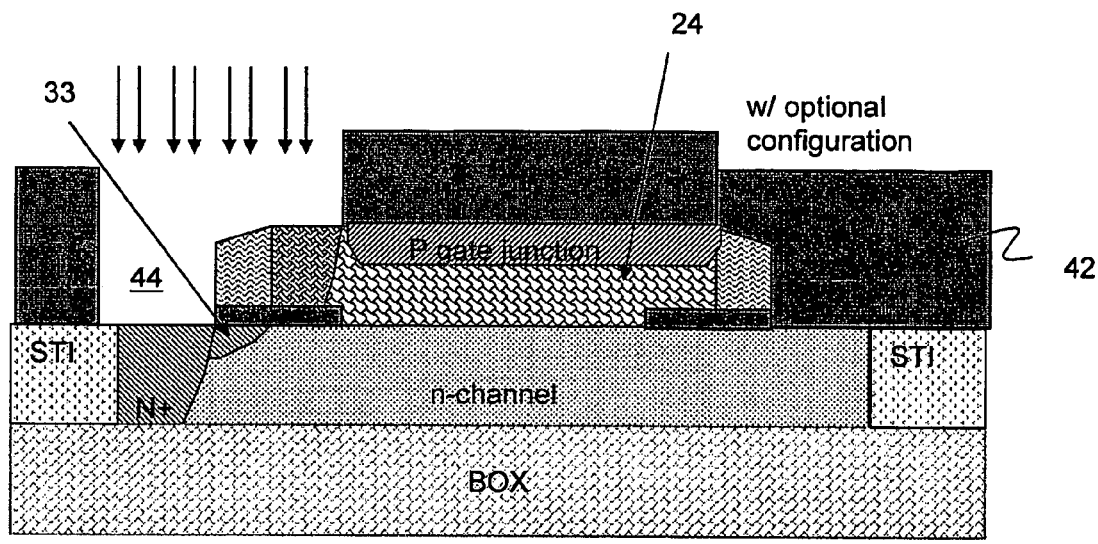

FIG. 11 shows an alternative to processing steps shown in FIG. 10 and a respective structure. In a conventional manner, a photoresist 42 is deposited over the structure of FIG. 10. In a conventional manner using photolithographic and etching processes, an opening 44 is formed over the source region. In a preferred embodiment, the opening will only be over the source region and would not extend to over the gate polysilicon layer 24; however, due to processing tolerances the opening may extend over a portion of the gate polysilicon layer 24. A conventional doping is performed to form N+ regions in the structure, while the photoresist 42 protects other portions of the structure. The photoresist 42 can then be stripped using conventional processes such as, for example, dilute HF stripping processes. This process forms an asymmetrical device and would typically be used for applications that would require higher drain voltages since the n-type doping concentration on the drain side is lower, thus enabling higher Vgd.

The processes described with reference to FIG. 11 may optionally be performed on the drain side of the structure.

Figure 12:
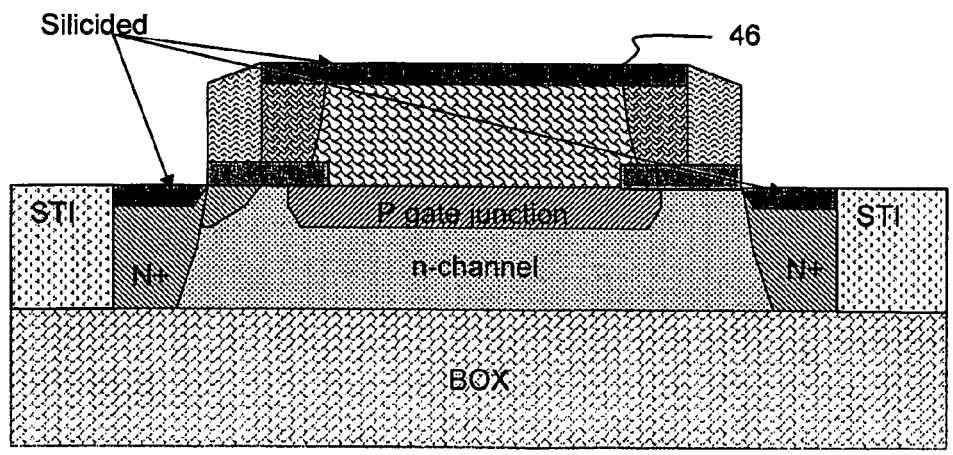
FIG. 12 shows a final structure and respective processing steps in accordance with an aspect of the invention.

FIG. 12 shows a final structure and respective processing steps in accordance with an aspect of the invention. After the implant processing sequences depicted in FIGS. 9, 10 and/or 11 an anneal is performed to activate and drive-in the ion implanted dopants. This anneal diffuses the p-type dopants in the gate polysilicon layer 24, through the opening 36, to form a pn junction (gate to channel junction) within the underlying SOI (Si layer) 14. As shown in FIG. 12, a self aligned silicided (salicide) process is utilized to provide ohmic electrical contact to the device. A refractory metal 48 is deposited over the entire substrate and an (one step or two step) anneal to react the metal to exposed Si (and polysilicon) regions is utilized with a subsequent etch/strip to remove any unreacted metals. The refractory metal may be, for example, Ti, Co or Ni, to name a few such metals. The structure of FIG. 12 undergoes an annealing process at about 300° C. to 900° C. for about 1 second to 60 seconds depending on the conductive metal utilized to form a silicide on the gate polysilicon layer 24 and the exposed SOI (Si layer) 14.

Ic Product Assemblies

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input devices.

Design Structure

Figure 13:
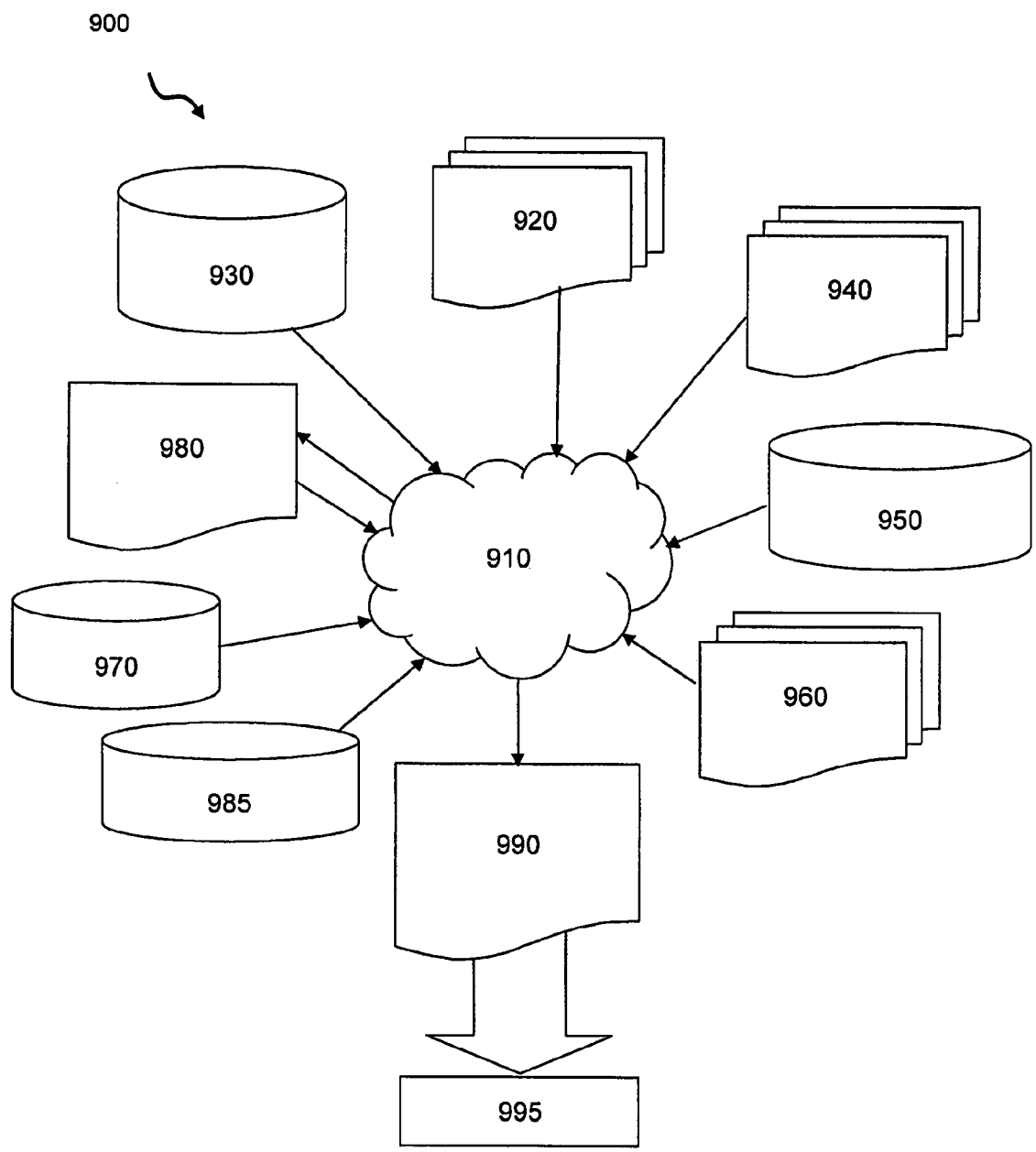
FIG. 13 is a flow diagram of a design process used in semiconductor design, manufacture, and/or test.

FIG. 13 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIG. 12 in the form of schematics or HDL, a hardware-description language (e.g., Verilog, VHDL, C, etc.). Design structure 920 may be contained on one or more machine-readable media. For example, design structure 920 may be a text file or a graphical representation of an embodiment of the invention as shown in FIG. 12. Design process 910 preferably synthesizes (or translates) embodiments of the invention as shown in FIG. 12 into a netlist 980, where netlist 980 is, for example, a list of wires, transistors, logic gates, control circuits, I/O, models, etc. that describes the connections to other elements and circuits in an integrated circuit design and recorded on at least one of machine readable media. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIG. 12, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce embodiments of the invention as shown in FIG. 12. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A method of forming a device comprising:
    forming a gate oxide layer over an SOI layer;
    etching a portion of the gate oxide layer to expose a portion of the SOI layer;
    depositing a poly layer in contact with the exposed portion of the SOI layer and in contact with the gate oxide layer;
    patterning the poly layer to expose portions of the gate oxide layer;
    depositing spacer material on sides of the patterned poly layer and over adjacent exposed portions of the gate oxide layer; and
    etching portions of the spacer material and the gate oxide layer,
    wherein the etching of the spacer material sets a profile of spacers on sides of the poly layer and etching the gate oxide layer removes or reduces a profile of the gate oxide layer to expose a channel of the SOI layer.

2. The method of forming a device of claim 1, wherein the spacers on the side of the poly layer protect the gate oxide layer from further etching.

3. The method of forming a device of claim 1, further comprising doping the poly layer while protecting other areas of the device in order to form a p-gate n-channel junction in the SOI layer through outdiffusion from the poly layer.

4. The method of forming a device of claim 1, further comprising doping a source region with an N-type extension implant through an opening in a photoresist formed on the poly layer and remaining portions of the device thereby forming an asymmetrical device.

5. The method of forming a device of claim 4, further comprising doping a drain region with an N-type extension implant through an opening in another photoresist formed on the poly layer and remaining portions of the device thereby forming a symmetrical device.

6. The method of forming a device of claim 1, further comprising forming a silicide over the poly layer.

7. The method of forming a device of claim 1, further comprising a MOSFET N well implant to form an n-channel in the exposed portion of the SOI layer.

8. The method of forming a device of claim 7, wherein the gate oxide layer is formed over the MOSFET N well implant.

9. The method of forming a device of claim 7, wherein the gate oxide layer is about 15 Å to 15 Å.

10. The method of forming a device of claim 8, wherein the gate oxide layer is limited to over the n-channel of the SOI layer.

11. The method of forming a device of claim 7, wherein the n-channel implant includes an angled implantation so as to ensure that dopant is implanted in the SOI layer below the gate oxide layer.

12. The method of forming a device of claim 11, wherein the gate oxide layer forms a collar around a perimeter of the poly layer to thereby prevent an n-Gate forming from self aligned nMOSFET source/drain implant from shorting to an underlying n-channel.

13. The method of forming a device of claim 12, wherein the poly layer and the gate oxide layer form a JFET.

14. The method of forming a device of claim 12, wherein the poly layer and the gate oxide layer form a FET in another region, wherein the gate oxide layer is not etched away to expose the underlying SOI in the FET.

15. The method of forming a device of claim 1, further comprising:
    depositing a photoresist over the spacers, gate oxide layer and the poly layer;
    forming an opening in the photoresist over a source region adjacent to a first side of the poly layer, spacers and gate oxide;
    performing a N-type extension implant through the opening to lower on-resistance;
    stripping the photoresist; and
    providing an activation anneal to form an asymmetrical device.

16. The method of forming a device of claim 15, further comprising:
    depositing a photoresist over the spacers, gate oxide layer and the poly layer;
    forming an opening in the photoresist over a drain region adjacent to a second side of the poly layer, spacers and gate oxide, while blocking the N-type extension implant;
    performing a P-type extension implant through the opening;
    stripping the photoresist; and
    providing an activation anneal to form a symmetrical device.

17. The method of forming a device of claim 1, further comprising:
    depositing a photoresist over a source region, drain region and the poly layer;
    opening a hole in the photoresist over the poly layer, while blocking the source region and the drain region; and
    implanting a P type dopant in an exposed poly layer through the opening to form a p gate junction in an n-channel through outdiffusion from the gate poly layer.

18. The method of forming a device of claim 17, wherein the opening is confined within the areas defined by the spacers.

19. The method of forming a device of claim 17, wherein the dopant is Boron or Indium.

* * * * *